United States Patent [19]
Mita

[11] Patent Number: 5,835,033
[45] Date of Patent: Nov. 10, 1998

[54] DECODING APPARATUS AND METHOD FOR CODED DATA

[75] Inventor: Yoshinobu Mita, Kawasaki, Japan

[73] Assignee: Canon Kabushiki Kaisha, Tokyo, Japan

[21] Appl. No.: 553,914

[22] Filed: Nov. 6, 1995

[30]    Foreign Application Priority Data

| Nov. 8, 1994 | [JP] | Japan | 6-273540 |
| Dec. 6, 1994 | [JP] | Japan | 6-301907 |
| Dec. 22, 1994 | [JP] | Japan | 6-320117 |

[51] Int. Cl.$^6$ ................................................. H03M 7/46
[52] U.S. Cl. ................................. 341/63; 341/65; 341/67
[58] Field of Search ................................. 341/63, 65, 67

[56]    References Cited

U.S. PATENT DOCUMENTS

| 4,899,149 | 2/1990 | Kahan | 341/67 |
| 5,181,031 | 1/1993 | Tong et al. | 341/65 |
| 5,208,593 | 5/1993 | Tong et al. | 341/65 |
| 5,226,082 | 7/1993 | Kustka | 380/46 |
| 5,404,138 | 4/1995 | Kim et al. | 341/67 |
| 5,594,437 | 1/1997 | O'Malley | 341/67 |

*Primary Examiner*—Marc S. Hoff
*Attorney, Agent, or Firm*—Fitzpatrick, Cella, Harper & Scinto

[57]    ABSTRACT

A decoding apparatus includes a first decoder for performing decoding by dividing first coded data consisting of a bit sequence into divided data each having a bit length of 1 bit or more, and a second decoder which performs decoding on the basis of the "1" or "0" run length and the remaining bit string of second coded data consisting of a bit sequence, and shares at least a circuit portion with the first decoder.

32 Claims, 16 Drawing Sheets

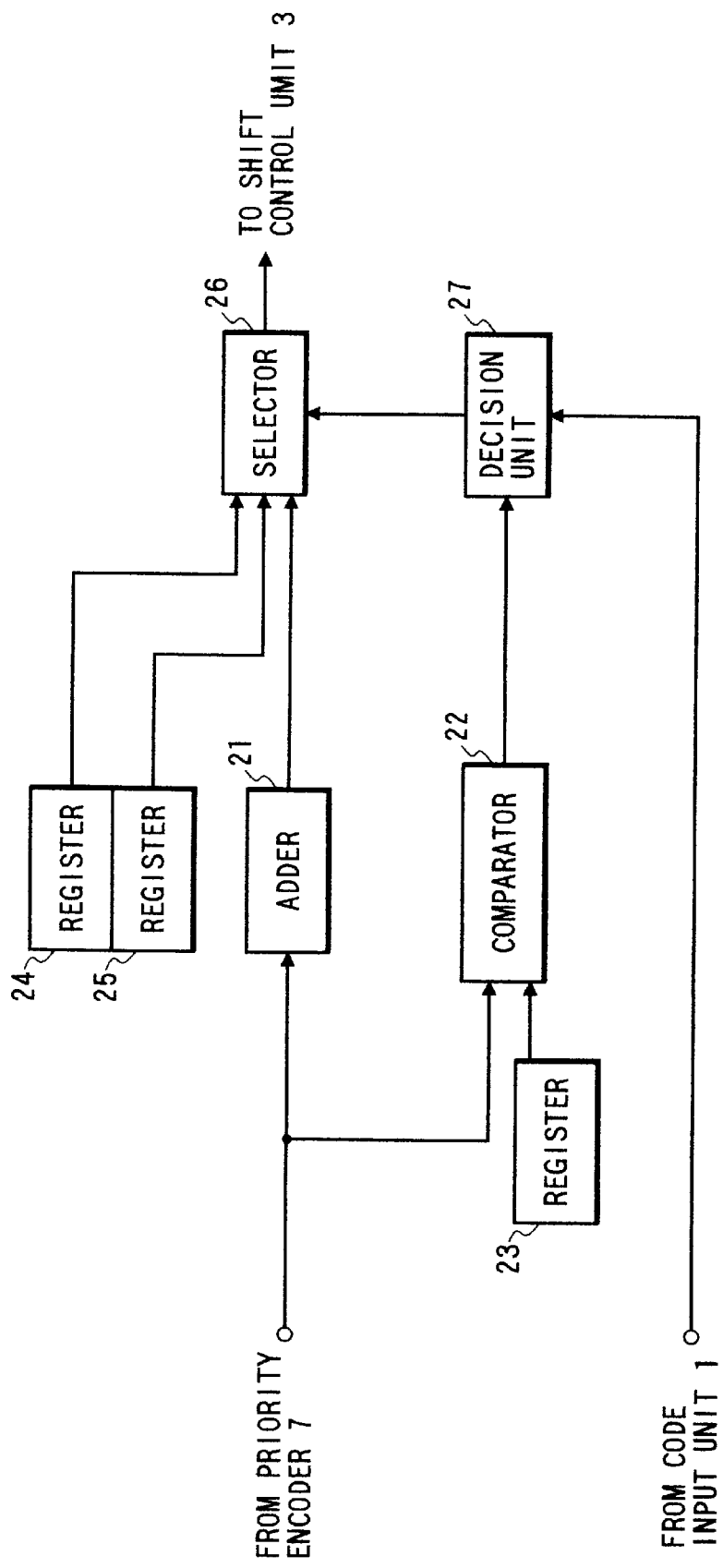

FIG. 4

```
0  0  1  0  1  ⎫
0  0  1  1  1  ⎬ CASE 1
0  0  1  1  0  ⎭
0  0  1  0  0  0  0  0  ⎫
0  0  1  0  0  0  0  1  ⎪
0  0  1  0  0  0  1  0  ⎪
0  0  1  0  0  0  1  1  ⎬ CASE 2
0  0  1  0  0  1  0  0  ⎪
0  0  1  0  0  1  0  1  ⎪
0  0  1  0  0  1  1  0  ⎪
0  0  1  0  0  1  1  1  ⎭
└─┬─┘  └─┬─┘  └───┬───┘
  A      B        C
```

FIG. 16

EXAMPLE OF TABLE

| | | |
|---|---|---|
| 0 | F | ⎫ |
| | F | |
| | F | ⎬ FIRST ANALYSIS |
| | F | |
| | ~ | |
| | F | |
| | R1 | |
| | R2 | ⎭ |
| A(R1) | F | ⎫ |
| | F | ⎬ SECOND ANALYSIS |
| | F | (FIRST FUNCTION CALLING) |
| | R3 | ⎭ |
| A(R2) | F | ⎫ |
| | F | ⎬ THIRD ANALYSIS |
| | F | (SECOND FUNCTION CALLING) |
| | F | ⎭ |
| A(R3) | F | ⎫ |
| | F | ⎬ SECOND ANALYSIS |
| | F | (THIRD FUNCTION CALLING) |
| | R4 | ⎭ |
| A(R4) | F | ⎫ |
| | F | ⎬ THIRD ANALYSIS |
| | R5 | (FOURTH FUNCTION CALLING) |
| | R6 | ⎭ |
| A(R5) | F | ⎫ |
| | F | ⎬ FOURTH ANALYSIS |
| | F | (FIFTH FUNCTION CALLING) |
| | F | ⎭ |
| A(R6) | F | ⎫ |
| | F | ⎬ SIXTH ANALYSIS |
| | F | (SIXTH FUNCTION CALLING) |
| | F | ⎭ |

DECODING APPARATUS AND METHOD FOR CODED DATA

BACKGROUND OF THE INVENTION

1. Field of the Invention

The present invention relates to a decoding method and apparatus for coded data and, more particularly, to a method and apparatus, which are suitably applied to decoding of Huffman codes.

2. Related Background Art

Conventionally, in order to transfer/store still images in the fields of, e.g., color facsimile systems, still image video telephone systems/meeting systems, newspaper picture transfer, and the like, it is a general practice to encode data using a color still image coding (to be referred to as JPEG hereinafter) method as an international standard coding method.

In the JPEG method, image data is divided into blocks, and the blocks are subjected to discrete cosine transformation to obtain DCT coefficients. The DCT coefficients are quantized and zigzag-scanned, and thereafter, quantized data are converted into Huffman codes.

On the other hand, the coding methods for dynamic images are also internationally standardized. For example, the H.261 (coding for communication) method for a TV meeting system, the MPEG (dynamic image coding for storage) method are used as standard methods. In these coding methods, a frame as a reference is intra-frame-coded, and other frames are coded by motion compensation. The intra-frame coding is based on block division and DCT as in the JPEG method. In coding based on motion compensation as well, motion vectors are calculated in units of blocks, differences from a reference block are calculated, and the difference blocks are DCT-transformed to obtain DCT coefficients. The DCT coefficients are quantized, and Huffman codes are assigned to the quantization results, thus coding data.

Note that the Huffman codes are determined based on a statistical nature, and a dynamic image and a still image cannot use identical Huffman codes since they have different statistical natures. Since the JPEG standard method and the H.261 standard method or the MPEG standard method use different Huffman code lengths and features, it is often preferable to use decoding apparatuses with different arrangements since the capacity of a table used for decoding can be reduced and high-speed decoding can be attained.

For example, since the JPEG standard method can use different Huffman codes in units of images, and decoding must be performed by a hardware arrangement which comprises, e.g., a RAM, and is prepared in advance, independently of input Huffman codes, the type of system that can be used is limited. On the other hand, since the H.261 standard method, the MPEG standard method, and the like use Huffman codes fixed in units of images, a special-purpose hardware arrangement must be used to reduce the table capacity and to attain high-speed decoding.

However, in the above-mentioned conventional methods, when two or more different types of Huffman codes are to be decoded, different corresponding decoding apparatuses must be prepared, thus disturbing an application to a system which uses both still and dynamic images.

Conventionally, Huffman codes are used as coded data obtained by high-efficiency compression coding of image data. The Huffman codes are variable-length codes in which a short bit length is assigned to information with a high occurrence frequency, and a long bit length is assigned to information with a low occurrence frequency.

When such Huffman codes are decoded, a decoding table that stores decoded values of Huffman codes is conventionally used, and a decoded value is obtained by looking up this table using the Huffman codes.

There are two decode methods using the decoding table. In one method, if the maximum code length of the Huffman codes is, e.g., 16 bits, a decoding table having an address length of $2^{16}$ is used, and a decoded result is obtained by accessing this table using a 16-bit address.

In the other method, Huffman codes are analyzed in units of n bits, and a decoding table which stores decoded values or reference addresses and retrieval completion flags in units of n bits is used. The table is looked up using input n bits as an address, and it is checked based on the flag if decoding is continued or completed. If decoding is continued, retrieval for another n bits is performed using a value obtained by adding the n bits to the reference address as an address. By repeating this operation until the flag indicates completion of decoding, a decoded value is obtained.

However, the method of attaining decoding by a single table retrieval operation requires a considerably large table capacity, and is not suitable for when the entire decoding apparatus is to be integrated on an LSI or when a system has no CPU. In the method of analyzing codes in units of n bits, if the value n is small, the number of times of table retrieval becomes large, and a high-speed operation cannot be attained. On the other hand, if the value n is large, a table space having an n-bit address length must be prepared after the reference address space, thus requiring a large memory space. This is because when the Huffman code length can be decoded by less than n bits, a portion corresponding to extra bits is wasted, and as a result, the decoding table size increases.

SUMMARY OF THE INVENTION

It is an object of the present invention to provide a decoding apparatus and method for coded data, which can decode data coded by different methods using a simple circuit arrangement.

In order to achieve the above object, a coded data decoding apparatus according to an embodiment of the present invention comprises first decoding means for performing decoding by dividing coded data consisting of a bit sequence into divided data each having a bit length of 1 bit or more, and second decoding means for performing decoding on the basis of a "1" or "0" run length and a remaining bit string of coded data, the second decoding means sharing at least a portion of a circuit with the first decoding means.

According to this embodiment, since the first and second decoding means share at least a retrieval table or a shifter, data coded by different methods can be decoded by a simple circuit arrangement.

The present invention has been made to solve the above-mentioned problems, and has as its another object to provide a decoding apparatus which can reduce the capacity of a decoding table and can attain high-speed decoding, and a method of generating or forming a decoding table.

According to another embodiment of the present invention, a decoding apparatus for decoding coded data input as a bit stream by analyzing the coded data by retrieving requested data from a code table in one or a plurality of steps in units of a predetermined number of bits, comprises control means for, when decoding is not completed, setting the number of bits to be analyzed in the next step on the basis of information obtained from the decoding table, and controlling decoding on the basis of the set number of bits.

According to the above embodiment, since bits of coded data are analyzed by a bit length having a variable length size, decoding can be efficiently performed, thus reducing the table capacity and attaining high-speed decoding.

BRIEF DESCRIPTION OF THE DRAWINGS

FIG. 4 is a view showing an example of Huffman codes;

FIG. 16 is a view showing an example of the table format based on the third table forming method;

DETAILED DESCRIPTION OF THE PREFERRED EMBODIMENTS

Figure 1:
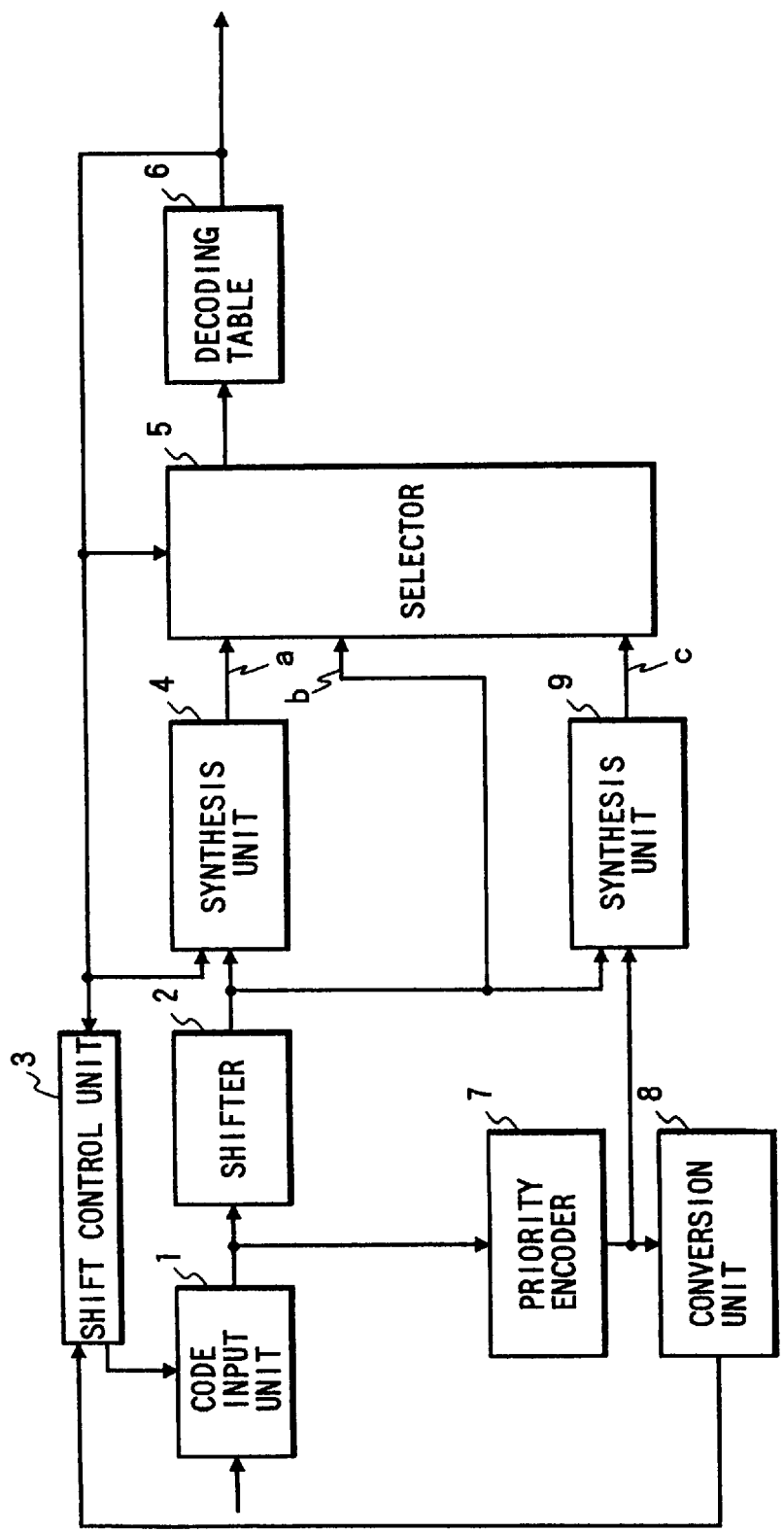
FIG. 1 is a block diagram showing the arrangement of a coded data decoding apparatus according to the first embodiment of the present invention.

The first embodiment of the present invention will be described below with reference to the accompanying drawings. FIG. 1 is a block diagram showing the arrangement of a coded data decoding apparatus according to the first embodiment of the present invention.

Referring to FIG. 1, a code input unit 1 fetches a bit sequence of a Huffman code from an external device. A shifter 2 shifts the bit sequence. A shift control unit 3 controls the code input unit 1 and the shifter 2. A synthesis unit 4 generates a table address required for decoding on the basis of the bit string supplied from the shifter 2 and a reference address supplied from a decoding table 6. A selector 5 switches an output from among an output b from the shifter 2, and outputs a and c from the synthesis unit 4 and a synthesis unit 9. The decoding table 6 stores decoded values in decoding processing and various kinds of control information. A priority encoder 7 outputs a "0" run length from the beginning of the bit sequence. A conversion unit 8 supplies a value obtained by adding 1 to the output from the priority encoder 7 as a shift amount to the shift control unit 3. The synthesis unit 9 generates a table address required for decoding on the basis of the bit string supplied from the shifter 2 and the output from the priority encoder 7. Note that the input bit width of the priority encoder 7 need only correspond to the maximum value of the "0" run lengths of existing Huffman codes. In the above-mentioned arrangement, the code input unit 1 to the decoding table 6 correspond to the first decoding means, and the priority encoder 7 to the synthesis unit 9 correspond to an additional portion for realizing the second decoding means.

Figure 2A:
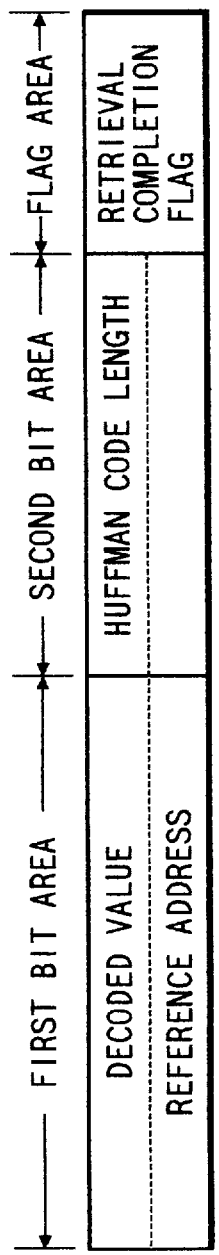
FIGS. 2A and 2B are views showing the word format of a decoding table according to the first embodiment of the present invention.
Figure 2B:

FIGS. 2A and 2B show the word format at respective addresses in the decoding table 6. In the case of decoding by the first decoding means, as shown in FIG. 2A, the word format includes a first bit area, a second bit area, and a flag area. The first bit area stores a decoded value obtained by decoding a Huffman code, and the second bit area stores a Huffman code length indicating the bit length of the Huffman code corresponding to the decoded value. The flag area stores a retrieval completion flag "1" indicating completion of retrieval or "0" indicating continuation of retrieval. In the case of decoding by the second decoding means, as shown in FIG. 2B, a decoded value, and a length indicating a total of a "0" run length and the subsequent bit string excluding "1"s are stored.

A case will be explained below wherein the coded data decoding apparatus according to the first embodiment of the present invention is used as the first decoding means.

In the decoding method of the first decoding means, coded data such as a Huffman code is divided into divided data each having a bit length of 1 bit or more, and the decoding table is looked up using the divided data as addresses. The decoding table stores a decoded value when the decoding is completed, or stores a reference address indicating the start address of the next decoding table with respect to table contents for a bit string which requires some other bits to be analyzed to complete decoding. An operation for looking up the decoding table using the next bit string as an address while considering the reference address to be "0" is repeated until the decoding is completed. The decoding table stores the decoded value and its bit length, and the shifter 2 shifts the bit string by the number of decoded bits.

More specifically, as shown in FIG. 1, the code input unit 1 fetches a bit sequence of a Huffman code supplied from an external storage device or a communication device under the control of the shift control unit 3. The bit sequence fetched by the code input unit 1 is output to the shifter 2. The shifter 2 shifts a non-analyzed portion of the Huffman code under the control of the shift control unit 3, and supplies divided data consisting of a bit string corresponding to the number of bits to be analyzed next to the synthesis unit 4 and the selector 5.

The synthesis unit 4 generates an address to be designated next of the decoding table 6 on the basis of a reference address supplied from the decoding table 6 and the divided data supplied from the shifter 2.

Then, when the value of the retrieval completion flag supplied from the decoding table 6 is "1", the selector 5 outputs an address b supplied from the shifter 2 to the decoding table 6; when the value of the retrieval completion flag is "0", the selector 5 outputs an address a supplied from the synthesis unit 4 to the decoding table 6.

The decoding table 6 outputs data stored at the address supplied from the selector 5. When the retrieval completion flag in the flag area shown in FIG. 2A is "1", the decoded value stored in the first bit area is determined as a decoded result. At this time, the Huffman code length stored in the second bit area is supplied to the shift control unit 3, and the code input unit 1 and the shifter 2 are operated under the control of the shift control unit 3 so as to shift the input data by the number of bits corresponding to the supplied Huffman code length. Then, the next code is analyzed.

On the other hand, as a result of retrieval in the decoding table 6, when the retrieval completion flag is "0", the value stored in the first bit area is interpreted as a reference address, which is supplied to the synthesis unit 4. The synthesis unit 4 fetches the next divided data having a bit length of 1 bit or more from the shifter 2, and generates a new address which includes the reference address as upper bits, and the divided data fetched from the shifter 2 as lower bits. The decoding table 6 supplies the value "0" of the retrieval completion flag to the selector 5 to supply the address generated by the synthesis unit 4 to the decoding table 6, thus performing retrieval with respect to the decoding table 6 again. This operation is repeated until the retrieval completion flag becomes "1". When the retrieval completion flag is "1", the value stored in the first bit area is determined as a decoded result. Note that the bit string of the code used in analysis performed when the retrieval completion flag is "0" is discarded by the shifter 2 under the control of the shift control unit 3.

The reference address may be used as an offset address in place of upper bits of the address in the next table retrieval, and a value corresponding to the next divided data to be analyzed may be added in the synthesis unit 4. At this time, the number of bits required for the first bit area increases. However, since an address corresponding to a non-existing bit string can be omitted in terms of the characteristics of Huffman codes, and the address length decreases in some cases, the capacity of the decoding table 6 can be reduced.

A case will be explained below wherein the coded data decoding apparatus according to the first embodiment of the present invention is used as the second decoding means.

In the decoding method of the second decoding means, a "0" (in some cases, "1") run length from the beginning of coded data such as a Huffman code is counted, and the retrieval with respect to the decoding table is performed using an address generated by combining the count value and the subsequent remaining bit string. Since the first bit of the bit string after the run of "0"s is always "1", the capacity of the decoding table can be halved by omitting this "1". When the address of the decoding table is generated by combining a bit string having a largest bit length of those after the run of "0"s of existing codes, and the count value of the run of "0"s, decoding can be completed by a single retrieval operation from the decoding table.

More specifically, as shown in FIG. 1, the output from the code input unit 1 is input to the priority encoder 7. The priority encoder 7 counts a "0" run length from the beginning of the bit sequence, and outputs the count value to the conversion unit 8 and the synthesis unit 9.

The conversion unit 8 supplies a shift amount obtained by adding 1 to the output from the priority encoder 7 to the shift control unit 3. The shifter 2 supplies a bit string, from which the run of "0"s and the subsequent bit "1" are excluded, to the synthesis unit 9 under the control of the shift control unit 3. The reason why the conversion unit 8 adds 1 is to skip both the run of "0"s and the subsequent bit value "1".

Thereafter, the synthesis unit 9 generates an address c including the bit string supplied from the shifter 2 as upper bits and the output from the priority encoder 7 as lower bits, and supplies the address c to the selector 5. The selector 5 selects this address c and outputs it to the decoding table 6. Note that the bit length of the bit string supplied from the shifter 2 to the synthesis unit 9 need only be equal to or larger than a length obtained by subtracting 1 from a length from which a "0" run length at the beginning of the code is excluded of all the existing Huffman codes.

Subsequently, the decoding table 6 outputs a decoded value stored at the address c as a decoded result, and supplies a length stored together with the decoded value to the shift control unit 3 so as to control the shift amount of the shifter 2 to skip the decoded bit string in a bit sequence, thus preparing for decoding of the next code.

As described above, according to the first embodiment of the present invention, the second decoding means shares the shifter 2 and the decoding table 6 with the first decoding means, and two different decoding methods can be realized by a simple circuit arrangement.

Figure 3:
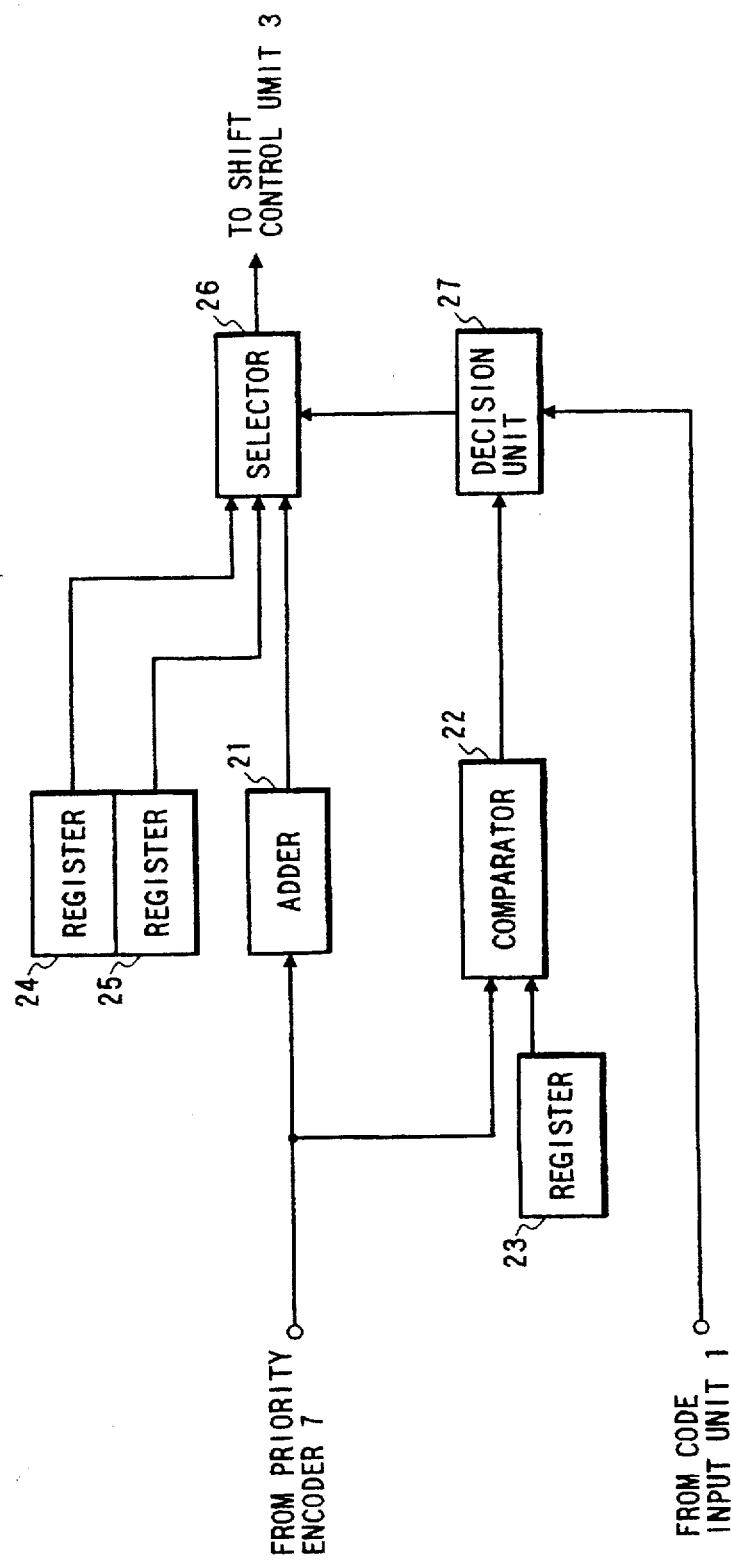
FIG. 3 is a block diagram showing the arrangement of a conversion unit according to the second embodiment of the present invention.

A coded data decoding apparatus according to the second embodiment of the present invention will be described below with reference to the accompanying drawings. The arrangement of the second embodiment is substantially the same as that of the first embodiment shown in FIG. 1, except that the arrangement of the conversion unit 8 is slightly different from that in the first embodiment. FIG. 3 is a block diagram showing the arrangement of the conversion unit 8 according to the second embodiment of the present invention. In the following description, a case will be exemplified wherein data coded by the H.261 method is input to the second decoding means.

In the case of the H.261 method, the maximum "0" run length of a Huffman code is 11, and the bit length of a total of the subsequent bit "1" and the remaining bits is a maximum of 4 (except for a bit indicating a sign). Therefore, a table having only 256 addresses designated by a total of 8 bits, i.e., 4 bits indicating the "0" run length and 4 bits as the remaining bit length, need be prepared. However, as an exception, as shown in FIG. 4, when the "0" run length is 2, the synthesis unit 9 must synthesize an address by adding 5 bits in areas B and C in some cases. For this reason, a table having 512 addresses is required, and an idle portion is generated. In order to prevent this, the conversion unit 8 of the second embodiment comprises registers 23, 24, and 25, and a decision unit 27, as shown in FIG. 3.

More specifically, in FIG. 3, 1 is added to the "0" run length input from the priority encoder 7 by an adder 21 normally, and the sum is output as a shift amount to the shift control unit 3 shown in FIG. 1 via a selector 26. On the other hand, the output from the priority encoder 7 shown in FIG. 1 is also input to a comparator 22, and is compared with a "0" run length=2 set in the register 23. The comparison result is supplied to the decision unit 27.

The decision unit 27 controls the selector 26 on the basis of the comparison result supplied from the comparator 22 and a bit string supplied from the code input unit 1 so as to supply the output from the register 24 or 25, or the output from the adder 21 to the shift control unit 3. More specifically, the register 24 is set with a numerical value "2", and the register 25 is set with a numerical value "4". The area B shown in FIG. 4 corresponding to the third and fourth bits from the beginning of the bit string supplied from the code input unit 1 is discriminated by the decision unit 27. If the "0" run length is 2 and the area B is "00", the decision unit 27 controls the selector 26 to supply the output from the register 25 to the shift control unit 3; when the "0" run length is 2 and the area B is other than "00", the unit 27 controls the selector 26 to supply the output from the register 24 to the shift control unit 3.

Therefore, in the synthesis unit 9 shown in FIG. 1, in the case of a code of case 1 in FIG. 4, lower 3 bits and 1 bit at the beginning of the next code are synthesized with a "0" run length which is 2; in the case of a code of case 2 in FIG. 4, lower 4 bits are synthesized with a "0" run length which is 2. For this reason, 11 codes shown in FIG. 4 can be recognized by 8-bit information if all the codes are different from each other, and a table having 256 addresses need only prepared as the decoding table 6 shown in FIG. 1. Note that the comparator 22 and the register 23 in FIG. 3 may be included in the decision unit 27, and the decision unit 27 may discriminate a 5-bit bit string.

As described above, according to the second embodiment of the present invention, since a specific one of input bit strings is converted into another address by the conversion unit 8, an idle area in the decoding table 6 can be omitted.

A coded data decoding apparatus according to the third embodiment of the present invention will be described below with reference to the accompanying drawings. The arrangement of the third embodiment is substantially the same as that of the second embodiment, except that the arrangement of the conversion unit 8 is slightly different from that in the second embodiment.

More specifically, the conversion unit 8 in the third embodiment has no register 24 shown in FIG. 3, and the output from the priority encoder 7 is supplied to the synthesis unit 9 shown in FIG. 1 via the conversion unit 8. When the "0" run length is " and the area B in FIG. 4 is "00", the decision unit 27 in FIG. 3 controls the selector 26 to supply the output from the register 25 to the synthesis unit 9. At this time, the synthesis unit 9 in FIG. 1 receives "12" generated by the conversion unit 8 in place of the output from the priority encoder 7. Since the "0" run length of Huffman codes is a maximum of "11", and "12" corresponds to an empty area in the decoding table 6, when a decoded value is written in this area, a decoded result can be obtained by performing retrieval with respect to the decoding table 6 on the basis of a new address generated by the conversion unit 8. Note that the value stored in the register 25 may be either 4 or 5. This embodiment can be applied to data coded by a method other than the H.261 method.

As described above, according to the third embodiment of the present invention, when the code length from which the "0" run length and the subsequent bit "1" are excluded exceeds a prescribed number of bits, the code is divided into two or more data to generate a new address, and a decoded result is mapped in an empty area which is not used in the memory, thus reducing the table capacity.

A coded data decoding apparatus according to the fourth embodiment of the present invention will be described below with reference to the accompanying drawings. The arrangement of the fourth embodiment is substantially the same as that of the first embodiment shown in FIG. 1, except that the word format of the decoding table 6 used when the apparatus is used as the second decoding means is similar to that used when the apparatus is used as the first decoding means.

More specifically, the decoding table 6 shown in FIG. 1 stores, as the table contents of an address obtained by the synthesis unit 9, a jump address (reference address), the code length of a decoded portion, and a retrieval completion flag indicating continuation or completion of decoding. The priority encoder 7 counts a "0" run length from the beginning of coded data, and the synthesis unit 9 generates an address on the basis of the count value and the remaining bit string supplied from the shifter 2 to look up the decoding table 6. Thereafter, when the decoding is not completed, the shift control unit 3 controls the shift amount of the shifter 2 to skip the analyzed bit string and to supply new bits to be analyzed to the synthesis unit 4. In addition, the jump address is supplied from the decoding table 6 to the synthesis unit 4. Thereafter, the synthesis unit 4 generates a new address on the basis of new bits to be analyzed and the jump address, and retrieval with respect to the decoding table 6 is repeated until the retrieval completion flag indicates completion of decoding.

As for the "0" run length, if its numerical value is doubled, the number of bits is increased by only one bit. For this reason, analysis, i.e., decoding of most part of a Huffman code length can be attained by a table with an address smaller than the "0" run length. However, as for a code other than the "0" run length and the subsequent bit "1", the address of the decoding table 6 is increased by 1 bit every time a maximum code length is increased by 1 bit, thus requiring a doubled table capacity. For this reason, the number of bits of a code which is supplied from the shifter 2 to the synthesis unit 9, and from which the "0" run length and the subsequent bit "1" are excluded is limited to reduce the table capacity, and a remaining bit string as extra bits is repetitively analyzed.

As described above, according to the fourth embodiment of the present invention, the capacity of the retrieval table can be reduced by performing decoding by dividing a bit string from which the "0" run length and the subsequent bit "1" are excluded into divided data each having a bit length of 1 bit or more.

The embodiments of the present invention have been described. The first decoding means is applied to decoding of data coded by the JPEG method in which Huffman codes change in units of images, and the second decoding means is applied to decoding of data coded by the H.261 method or MPEG method in which Huffman codes are fixed. Thus, different coded data can be flexibly coped with, and since the table capacity and the conversion unit are determined, the design of the apparatus can be facilitated. In the second decoding means, the "0" run length at the beginning of code may be replaced by a "1" run length depending on the code system. Furthermore, the next analysis bit length may be stored in the second bit area when the reference address is stored in the first bit area of FIG. 2A, and the bit length of next divided data to be analyzed may be determined based on the next analysis bit length.

According to the above-mentioned embodiments, since data coded by different methods are decoded by a common decoding apparatus, the scale of the decoding apparatus can be reduced, and the load on decoding can also be reduced.

According to the above-mentioned embodiments, since at least the retrieval table or shifter that suffers the heaviest load of a hardware arrangement in the decoding apparatus and serves as the core of functions is shared, data coded by different methods can be decoded by a simpler circuit arrangement.

According to the above-mentioned embodiments, since the first conversion unit for operating the shift amount and the "0" run length is arranged, the capacity of the retrieval table can be reduced.

According to the above-mentioned embodiments, since the shift amount of the shifter is pre-stored in a register, the capacity of the retrieval table can be reduced.

According to the above-mentioned embodiments, since an empty area of the retrieval table is utilized, the capacity of the retrieval table can be reduced.

According to the above-mentioned embodiments, since the next divided data is analyzed with reference to the reference address, the capacity of the retrieval table can be reduced.

According to the above-mentioned embodiments, since decoding is performed by dividing a remaining bit string into divided data each having a bit length of 1 bit or more, the capacity of the retrieval table can be reduced.

Figure 5:
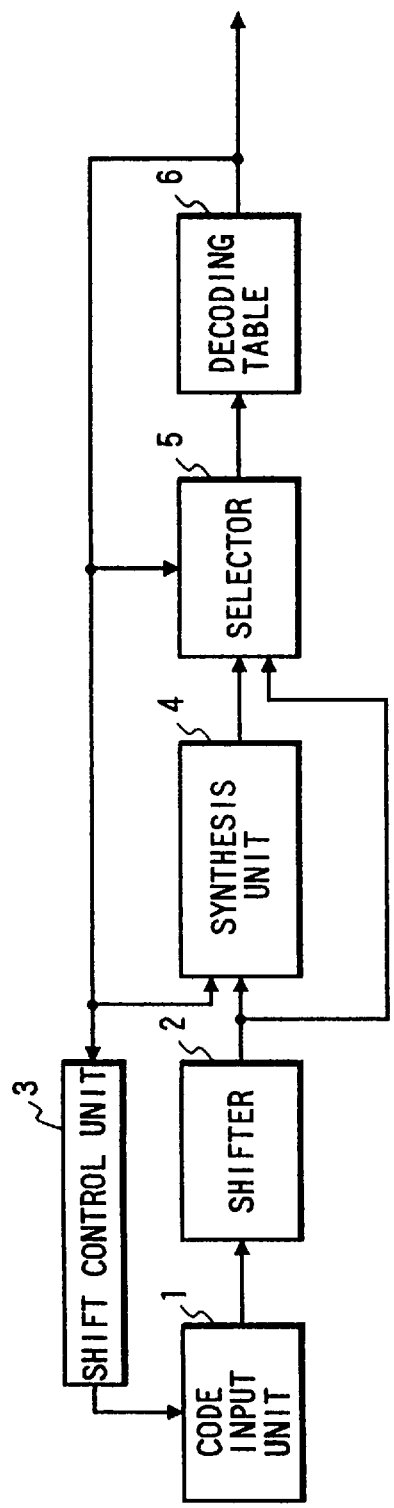
FIG. 5 is a block diagram showing the fifth embodiment of the present invention.

The fifth embodiment of the present invention will be described below with reference to the accompanying drawings. FIG. 5 is a block diagram showing the arrangement of a coded data decoding apparatus according to the fifth embodiment of the present invention. Note that FIG. 5 is commonly used in the sixth and seventh embodiments.

Referring to FIG. 5, a code input unit 1 fetches a bit sequence of a Huffman code from an external device. A shifter 2 shifts the bit sequence. A shift control unit 3 controls the code input unit 1 and the shifter 2 on the basis of information from a decoding table 6 (to be described later). A synthesis unit 4 generates a table address required for decoding on the basis of the bit string supplied from the shifter 2 and a reference address supplied from the decoding table 6. A selector 5 selects one of the outputs from the shifter 2 and the synthesis unit 4 in correspondence with a retrieval completion flag (to be described later) supplied from the decoding table 6, and supplies the selected output as an address to the decoding table 6. The decoding table 6 stores a decoded value or a reference address and other control information required for decoding processing.

Figure 6:
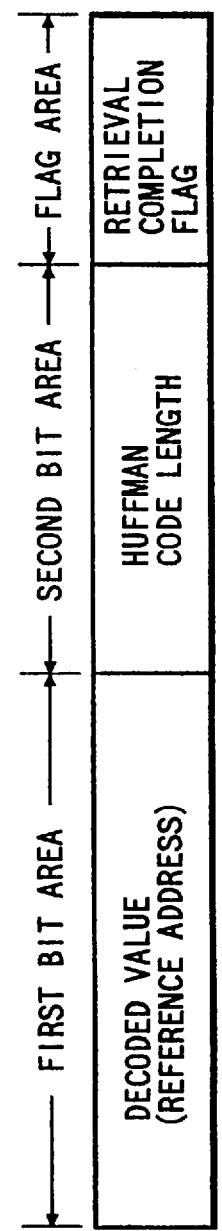
FIG. 6 is a view showing the word format of a decoding table according to the fifth embodiment.

FIG. 6 shows the word format at each address of the decoding table 6.

One address is assigned with first and second bit areas, and a flag area. The first bit area is located on the MSB side, and stores a decoded value. The decoded value is also used as a reference address, as will be described later. The second bit area stores a Huffman code length which indicates the number of analyzed bits for obtaining the decoded value in the first area. The flag area is assigned as the LSB, and stores a retrieval completion flag "1" when the decoding operation is completed by the decoded value in the first bit area; "0" when the decoding operation is continued. Note that the retrieval completion flag "1" or "0" is determined in advance on the basis of the occurrence frequency of codes constituting a Huffman code.

The operation of the above-mentioned arrangement will be described below.

A bit stream of a Huffman code supplied from an external storage device or a communication device is fetched by the code input unit 1 under the control of the shift control unit 3. The fetched bit stream is analyzed in units of codes each having a code length of 1 bit or more. For this reason, the bit stream is supplied to the shifter 2, and the shifter 2 shifts a non-analyzed portion of the Huffman code under the control of the shift control unit 3, thus obtaining a bit string having the number of bits to be analyzed. The bit string is supplied to the synthesis unit 4 and the selector 5.

The synthesis unit 4 synthesizes an address which includes the decoded value obtained as a result of previous retrieval from the decoding table 6 as upper bits, and the bit string to be analyzed from the shifter 2 as lower bits, and supplies the address to the selector 5. The selector 5 selects one of the synthesized address from the synthesis unit 4 and the bit string from the shifter 2 in correspondence with the retrieval completion flag as a result of the previous retrieval from the decoding table 6, and retrieval with respect to the decoding table 6 is performed using the selected output from the selector 5 as an address.

As a result of retrieval, when the retrieval completion flag is "1", the value in the first bit area shown in FIG. 6 is directly output as a decoded value. The selector 5 selects the next bit string to be analyzed supplied from the shifter 2 in correspondence with the flag "1".

On the other hand, when the retrieval completion flag is "0", it is determined that decoding is not completed yet, and the value in the first bit area is synthesized as a reference address with the next bit string to be analyzed supplied from the shifter 2 in the synthesis unit 4. The synthesized address is selected by the selector 5 in correspondence with the flag "0". The value in the second bit area indicates the number of bits in the currently analyzed bit string corresponding to the analyzed decoded value (reference address), and the shift control unit 3 controls the shifter 2 to exclude the number of bits.

When the above-mentioned operation is repeated until the retrieval completion flag becomes "1", the decoding operation for one Huffman code is completed. When the retrieval completion flag is "0", the bit string analyzed at that time is discarded by the shift control unit 3.

The reference address may be used as an offset address in place of the upper bits of the address in the next table retrieval, and a value corresponding to the next divided data to be analyzed may be added in the synthesis unit 4. At this time, the number of bits required for the first bit area increases. However, since an address corresponding to a non-existing bit string can be omitted in terms of the nature of a Huffman code, and the address length decreases in some cases, the capacity of the decoding table 6 can be reduced.

The operation of the shift control unit 3 will be described below with reference to the flow chart shown in FIG. 7.

In step S1, a comparator discriminates whether a decoding period is reached on the basis of the retrieval completion flag "1" or "0". If YES in step S1, the analysis code length is set to be 8 in step S2 to set the first decoding bit length of a new Huffman code. On the other hand, if NO in step S1, the analysis code length is set to be 2 in step S3 to continue the second or subsequent decoding operation.

In step S4, the shift amount is set in the shifter 2 to set data at a bit position that can be processed by the synthesis unit 4 or the selector 5, in correspondence with the analysis code length and the already analyzed code length. In step S5, the buffer capacity of the code input unit 1 is checked. If the buffer capacity becomes equal to or smaller than a prescribed amount, the next bit stream of the Huffman code is fetched from an external device in units of bytes (e.g., in units of 2 bytes), in step S6.

After the bit stream is fetched or after the buffer capacity reaches the prescribed amount in step S5, it is checked in step S7 if decoding is completed for all the bit streams. If NO in step S7, the flow returns to step S2 to repeat the above-mentioned processing. On the other hand, if YES in step S7, the processing ends.

The above-mentioned fifth embodiment aims at coping with a case wherein the maximum Huffman code length is about 16 bits, and table retrieval is completed with a high possibility upon analysis of the first 8 bits. When the table retrieval is not completed, the remaining codes are analyzed in units of 2 bits to retrieve the table. However, the generation frequency of such codes is small, and the total processing time can be shortened. In the second or subsequent table retrieval, since bit analysis is performed using a small number of bits, the synthesized address space of the reference address and bits to be analyzed becomes small, and idle table addresses corresponding to branchless portions of a Huffman tree that expresses a Huffman code can be omitted.

Figure 8:
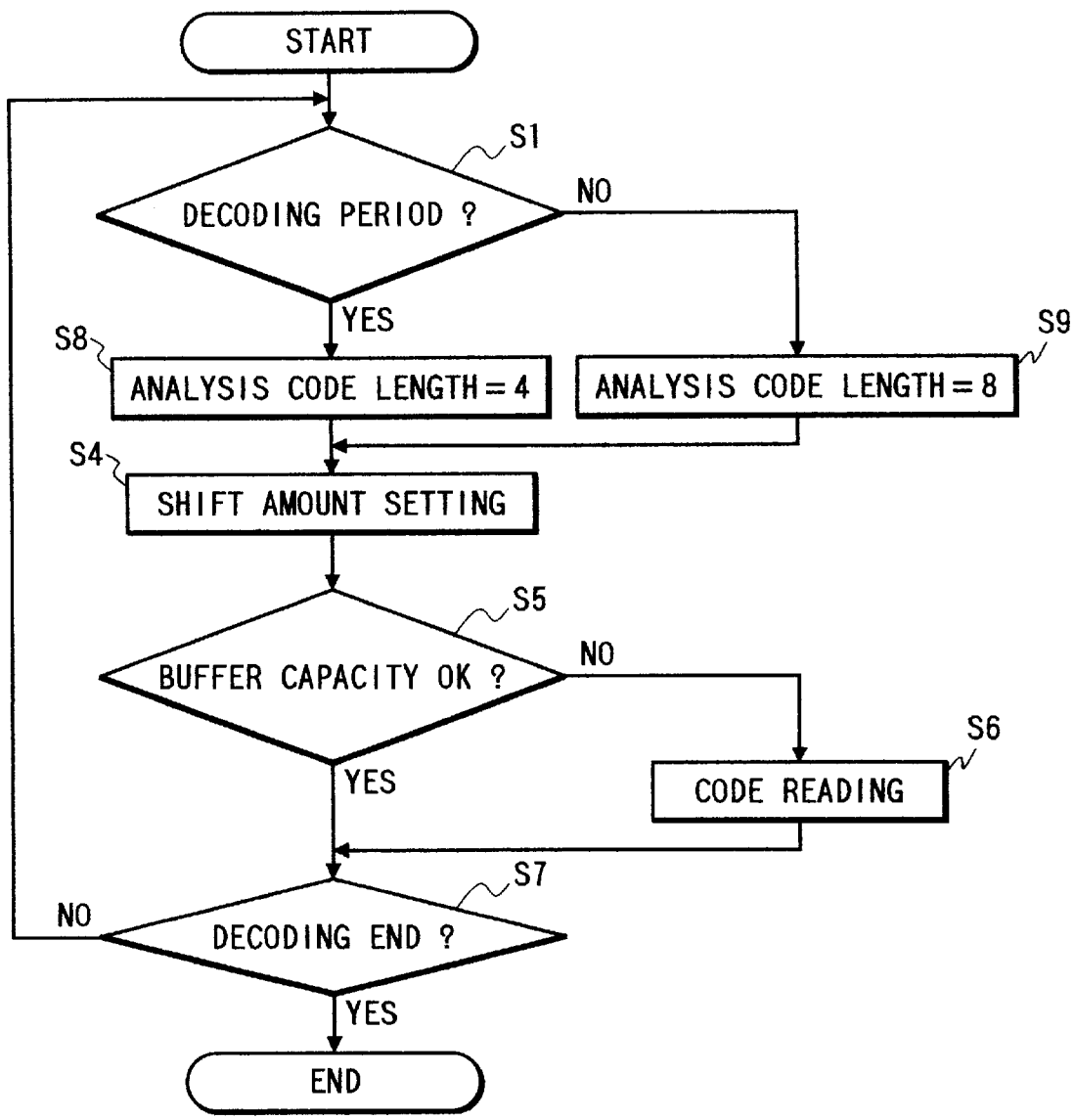
FIG. 8 is a flow chart showing the operation of a shift control unit according to the sixth embodiment.

FIG. 8 is a flow chart showing the operation of the shift control unit 3 on the basis of the decoding principle of a Huffman code using variable bit length analysis according to the sixth embodiment of the present invention. In the sixth embodiment as well, the circuit arrangement and the decoding table 6 shown in FIGS. 5 and 6 are used. Referring to FIG. 8, whether a decoding period is reached is discriminated in step S1. This checking operation is attained based on the retrieval completion flag in the decoding table 6.

If decoding of one code is completed, and a period between adjacent codes is determined, the first analysis code length for the next new Huffman code is set to be 4 in step S8. On the other hand, if decoding of one code is continued, and the decoding period is not determined, the second or subsequent analysis code length is set to be 8 in step S9. Thereafter, in step S4, the corresponding shift amount is set in the shifter 2 as in the fifth embodiment. The subsequent processing in steps S5 to S7 is performed in the same manner as in the fifth embodiment.

In the sixth embodiment, the retrieval is completed by 4-bit analysis corresponding to the first table retrieval operation with a high possibility, although the possibility is lower than that in the fifth embodiment. Idle table addresses in the first table retrieval operation can be greatly reduced, and a larger table area can be assigned to the second and subsequent table retrieval operations accordingly, thus allowing analysis in units of 8 bits. Therefore, in the second and subsequent retrieval operations, many bits can be analyzed in a unit time, and the decoding speed for a long Huffman code can be increased. For this reason, when the Huffman decoding method according to the sixth embodiment is applied to image compressed by the JPEG method, since a complicated image such as a character image including many high-frequency components tends to generate a long Huffman code, the decoding speed for such an image can be increased.

Figure 7:
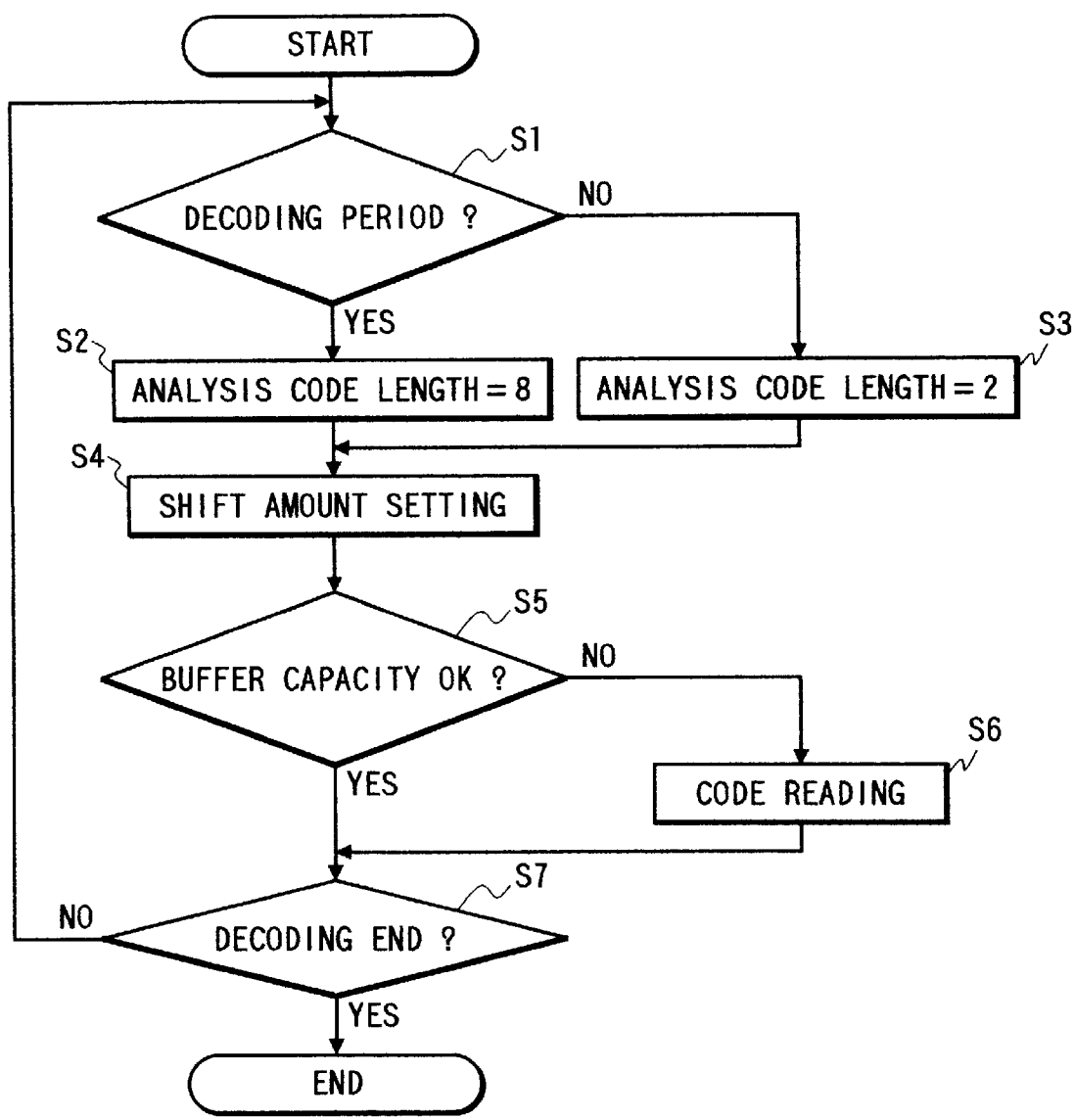
FIG. 7 is a flow chart showing the operation of a shift control unit according to the fifth embodiment.

In steps S3 and S9 in FIGS. 7 and 8, which show the operation of the shift control unit 3 in the fifth and sixth embodiments, the second or subsequent analysis code length for one code is set to be 2 and 8, respectively. However, the present invention is not limited to these values if the maximum code length of the Huffman code is limited. For example, if the maximum Huffman code length is 16 bits, the third analysis code length need only be set to be 4 in step S9 in FIG. 8.

In the seventh embodiment, the number of times of retrieval required for completing decoding is varied in units of Huffman codes. The number of bits to be analyzed in the first analysis of a Huffman code remains the same. However, when the retrieval completion flag as a result of analysis is "0", the number of bits to be analyzed next is designated based on information in the decoding table. For example, when the code length of a remaining code after the bits analyzed in the first analysis is 3 bits in maximum, if the next retrieval of 3 bits or less is performed, the number of required table addresses can be 1/32 that required for performing a single retrieval operation of about 8 bits. In addition, decoding can be completed in the next retrieval, and the processing speed remains the same. Therefore, in such a case, the decoding table is formed to set the number of bits to be retrieved next to be 3 bits or 3 bits or less.

As another example, assume that the number of remaining bits after the bits analyzed in the first analysis is 7 bits or more. In this case, most codes can be expressed by a binary value of the remaining 7 bits, and the number of codes consisting of 8 or more remaining bits is small. In such a case, a decoded value cannot be obtained in bit analysis of less than 7 bits, and the contents of the decoding table become the reference address for the next bit analysis. For this reason, many idle table addresses are wasted, and the decoding cannot be completed in the next bit analysis, thus prolonging the decoding time. In this case, in the third embodiment, information is set in the decoding table to perform the second retrieval of 7 bits after the first retrieval. Then, a decoded value can be obtained in the second retrieval with a very high possibility, and almost no table space is wasted due to disconnection of a branch of a Huffman tree or the reference address, thus simultaneously attaining high-speed processing and a small table capacity.

Figure 9:
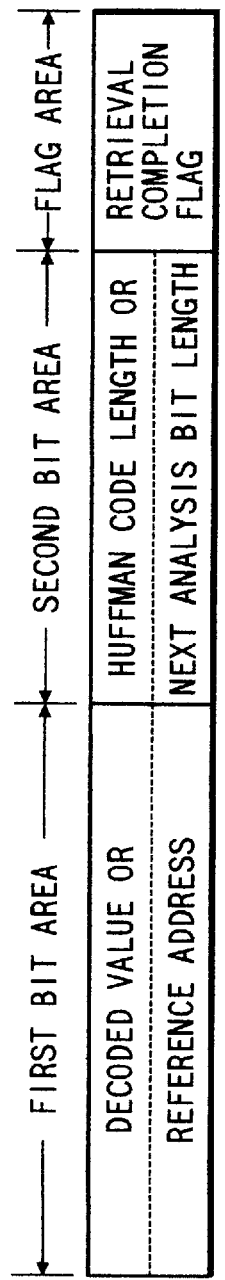
FIG. 9 is a view showing the word format of a decoding table according to the seventh embodiment.

FIG. 9 shows the word format of the decoding table, which can realize a method of sequentially changing the number of bits to be analyzed next during the current retrieval. A first bit area of a word stores a decoded value or a reference address indicating the reference for the next retrieval address. A second bit area of the word stores a Huffman code length corresponding to the decoded value or the bit length to be analyzed next. A flag area stores a retrieval completion flag indicating completion of retrieval.

When the retrieval completion flag is "1", the first bit area stores the decoded value, and the second bit area stores the corresponding Huffman code length. When the retrieval completion flag is "0", code analysis is in the middle of processing, and retrieval is continued. Thus, the first bit area stores the reference address for the next analysis, and the second bit area stores the number of bits to be analyzed next.

With this word format of the table, decoding can be executed by substantially the same circuit arrangement as in FIG. 5. In addition, the word width of the table need not be increased to assure the next analysis bit length.

Figure 10:
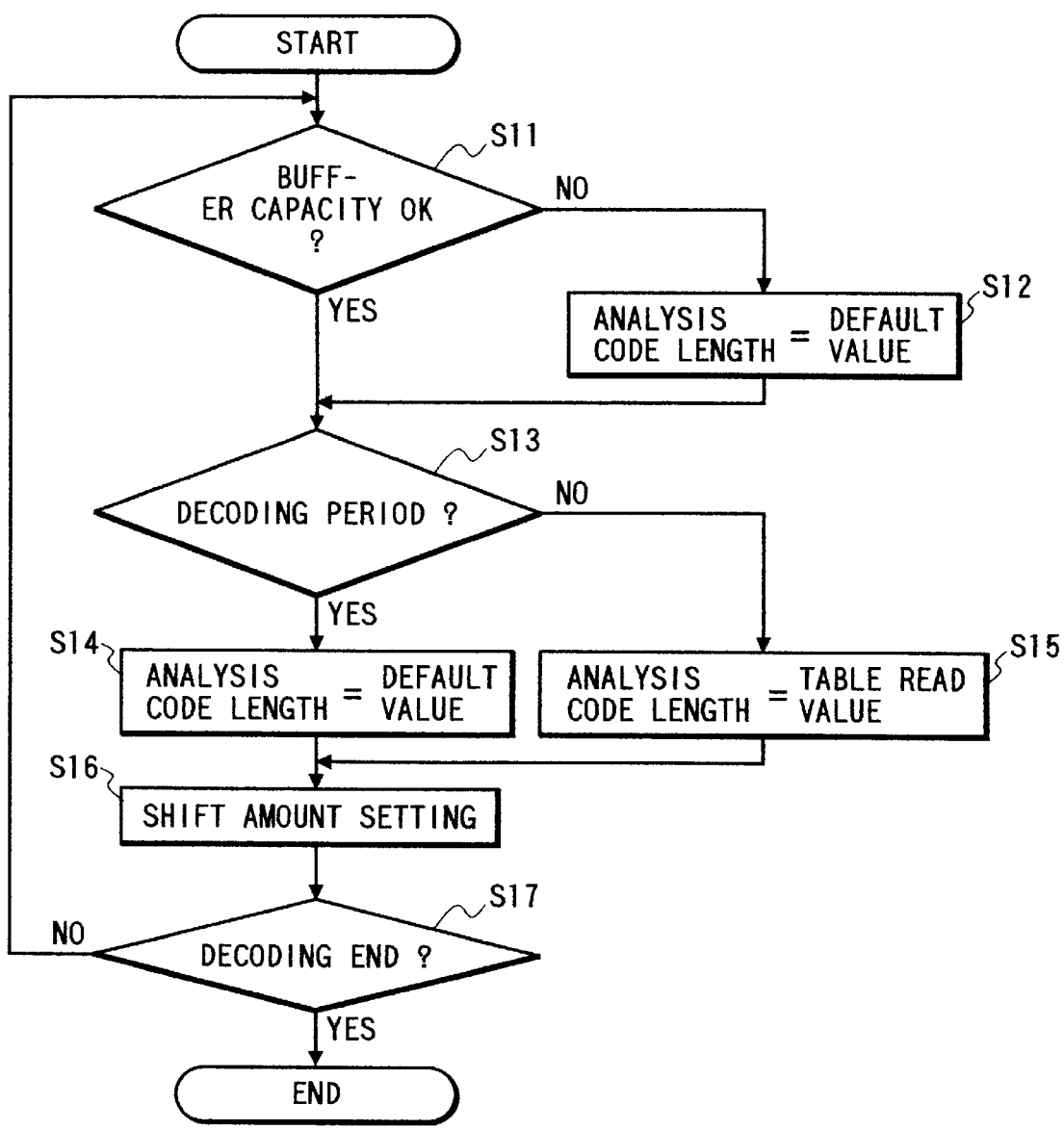
FIG. 10 is a flow chart showing the operation of a shift control unit according to the seventh embodiment.

FIG. 10 is a flow chart showing the operation of the shift control unit 3 according to the third embodiment. The operation shown in FIG. 10 is basically the same as those shown in FIGS. 7 and 8.

In step S11, the buffer capacity of the code input unit 1 is checked. If the buffer capacity is equal to or smaller than a prescribed amount, a bit stream is read in units of one byte or several bytes in step S12. In step S13, whether a decoding period is reached is checked based on the retrieval completion flag. If analysis of one code is completed, the analysis code length is set to be a default value in step S14; otherwise, the next analysis bit length in the second bit area in the decoding table is read out and set as the next analysis code length in step S15.

In step S16, a shift amount is set in the shifter 2 to adjust the bit positions of the bit strings in the synthesis unit 4 and the selector 5 in correspondence with the analysis code length. The shift amount to be set in the shifter 2 considers the number of bits which have been analyzed in the previous table retrieval and are discarded, as a matter of course. The processing in steps S11 to S16 is repeated until it is determined in step S17 that the processing is completed for all the bit streams.

In the seventh embodiment, since the next analysis bit length can be freely and optimally set in the second bit area of the table so as to eliminate idle table portions, the decoding table can be formed so as to prevent retrieval exceeding the maximum bit length.

Embodiments of a table forming method in the seventh embodiment will be explained below.

First Table Forming Method

In a method of easily and effectively reducing the table capacity upon formation of a table, when the bit length of a non-analyzed portion having the largest code length of a plurality of types of codes which may follow a bit string during decoding is shorter than the final analysis bit length for the final one of several analyses in decoding, the bit length of the non-analyzed portion replaces the final analysis bit length.

Figure 11:
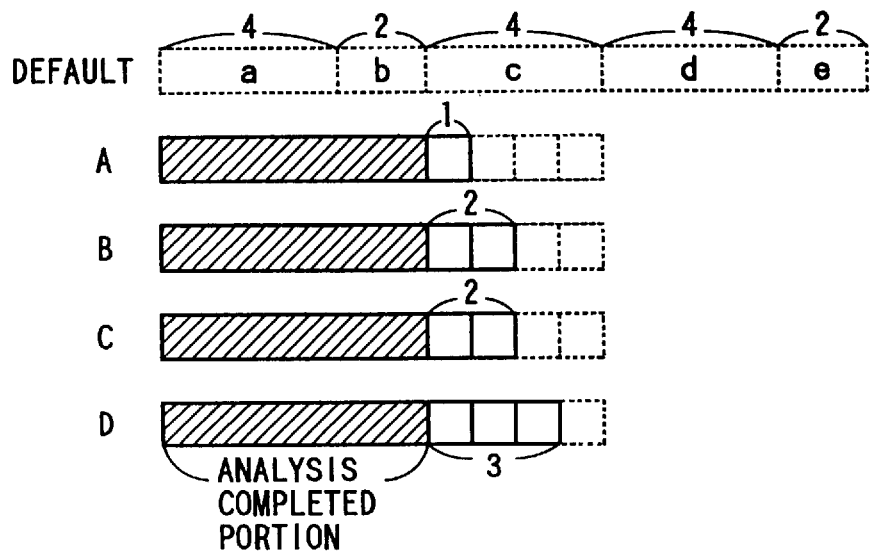
FIG. 11 is an explanatory view of table reduction by the first table forming method.

The above-mentioned method will be described in detail below with reference to FIG. 11. Assume that a Huffman code having a maximum code length of 16 bits is decoded in five steps: a=4 bits; b=2 bits; c=4 bits; d=4 bits; and e=2 bits. These values are default values, and the final step at the end of decoding may be changed. FIG. 11 illustrates a case wherein four different Huffman codes A, B, C, and D are to be decoded. Six bits in hatched portions have a common bit arrangement, the code A has a code length (=7), the codes B and C have a code length (=8), and the code D has a code length (=9). Therefore, the same analyses in the first and second steps, i.e., a=4 bits and b=2 bits, are performed for these codes.

In the third step, since c=4, $2^4=16$ table addresses are required as a destination table address for the reference address given in the second step. In contrast to this, in this invention, there are four codes A, B, C, and D that follow the bit arrangement indicated by hatching in FIG. 11, the maximum code length of these codes is 9 bits of the code D, and 3 bits remain non-analyzed. For this reason, the reference address and the next analysis bit length of not c=4 but c=3 are set in the table contents to be looked up in the second analysis. Thus, a destination address designated by the reference address need only describe $2^3=8$ table addresses and their contents by adding the next analysis bit length as an address, and 16−8=8 table addresses can be saved.

Second Table Forming Method

Figure 12:
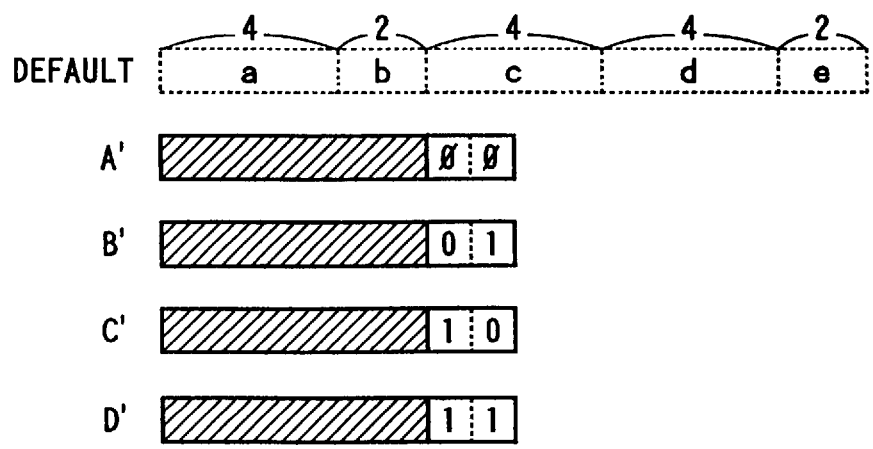
FIG. 12 is an explanatory view of table reduction by the second table forming method.

In FIG. 12, assume that, for example, a=4 in the first step, b=2 in the second step, and c=4 in the next step are set as default values. Also, assume that Huffman codes A', B', C', and D' each having a 7-bit length respectively have lower 2 bits (00), (01), (10), and (11), and include common portions indicated by hatching. In this case, in the second analysis, two table addresses are required for the reference address. When the first table forming method is applied to this case, the third analysis requires only 1-bit analysis in place of 4-bit analysis, but $2^1=2$ extra table addresses each are required, i.e., a total of 6 table addresses are required.

In view of the foregoing, in this method, b=3 is set in place of b=2 in the second analysis. With this control, as for the table amounts associated with the codes A', B', C', and D', table addresses for storing reference addresses can be omitted, and two table addresses can be omitted. However, when the second analysis length is changed, the table amount associated with codes other than the codes A', B', C', and D' may increase. Therefore, this method is effective when the analysis bit length is increased to be larger than a default value to save the reference addresses for specific codes, and when the entire table amount does not increase.

Third Table Forming Method

When the table capacity is to be minimized, the first and second forming methods are unsatisfactory. In this method, the maximum number of steps is changed or the analysis bit lengths a, b, c, . . . (a+b+c+ . . . =16) are varied in the respective steps if the number of steps remains the same, and the minimum number of table addresses and their table contents are determined based on every combination of the number of steps and the analysis bit lengths. In this case, as means for reducing the table capacity, only the first table forming method is used, and the number of combinations is determined by a method that does not overly increase the load on a computer. Therefore, this method avoids sequential changing of the next analysis bit length in correspondence with the analysis result of codes so that two steps are used for one code and three steps are used for another code upon decoding of codes having the same code length, since such a method infinitely increases the number of combinations. The first table forming method which can provide a large effect in correspondence with the default analysis bit lengths in the respective steps is used, and table reduction processing is performed in only the final step.

Figure 13:
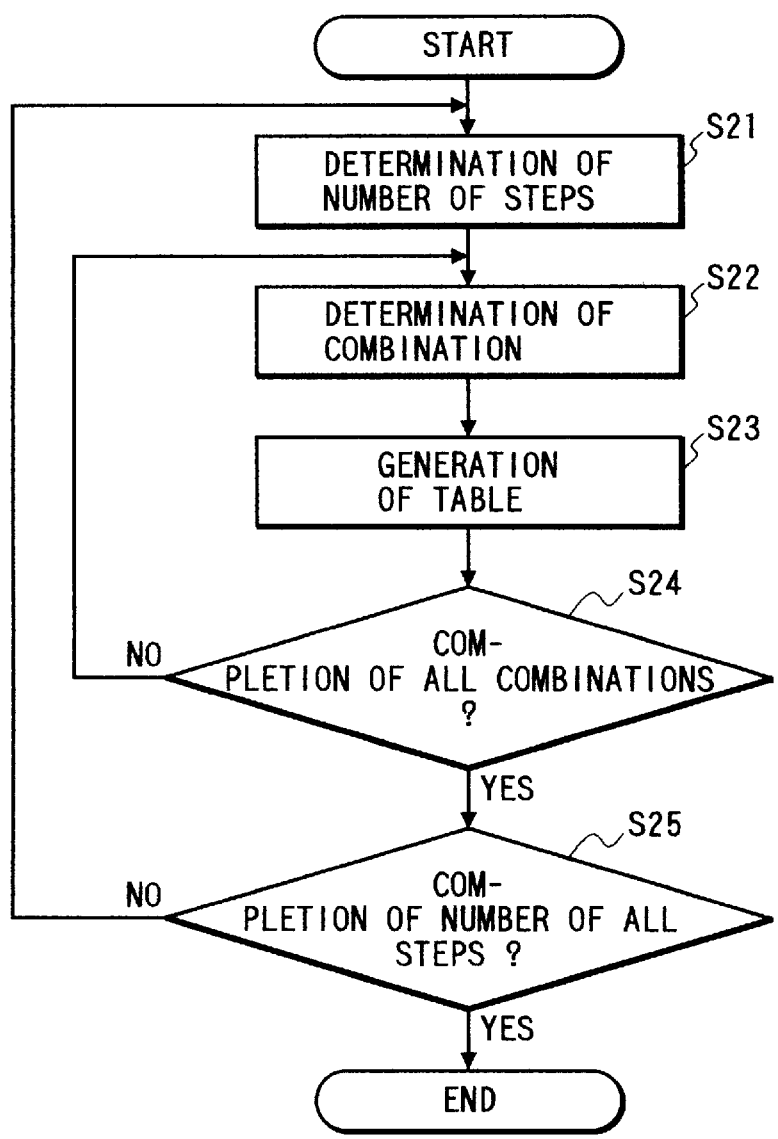
FIG. 13 is a flow chart showing the third table forming method.

FIG. 13 is a flow chart showing this method.

In step S21, the number of steps is determined. If the maximum code length is 16 bits, the number of steps is determined in turn from 1 to 16. In this case, one of these numbers of steps is selected. In step S22, the distribution of bits to be analyzed in the respective steps is determined. For example, if the number of steps is 2, there are 15 combinations (a, b)=(1, 15), (2, 14), (3, 13), . . . , (15, 1). One of these combinations is selected. In step S23, a table is formed in correspondence with the determined number of steps and the determined analysis bit lengths.

It is checked in step S24 if all the combinations of analysis bit lengths are completed. If NO in step S24, the flow returns to step S22, and another non-selected combination of analysis bit lengths is selected. On the other hand, if YES in step S24, it is checked in step S25 if processing is completed for all the numbers of steps. If NO in step S25, the largest number of steps associated with analysis of a maximum decoding length is set again. Note that there are 16 different numbers of steps, i.e., 1 to 16, if the maximum code length=16.

Figure 14:
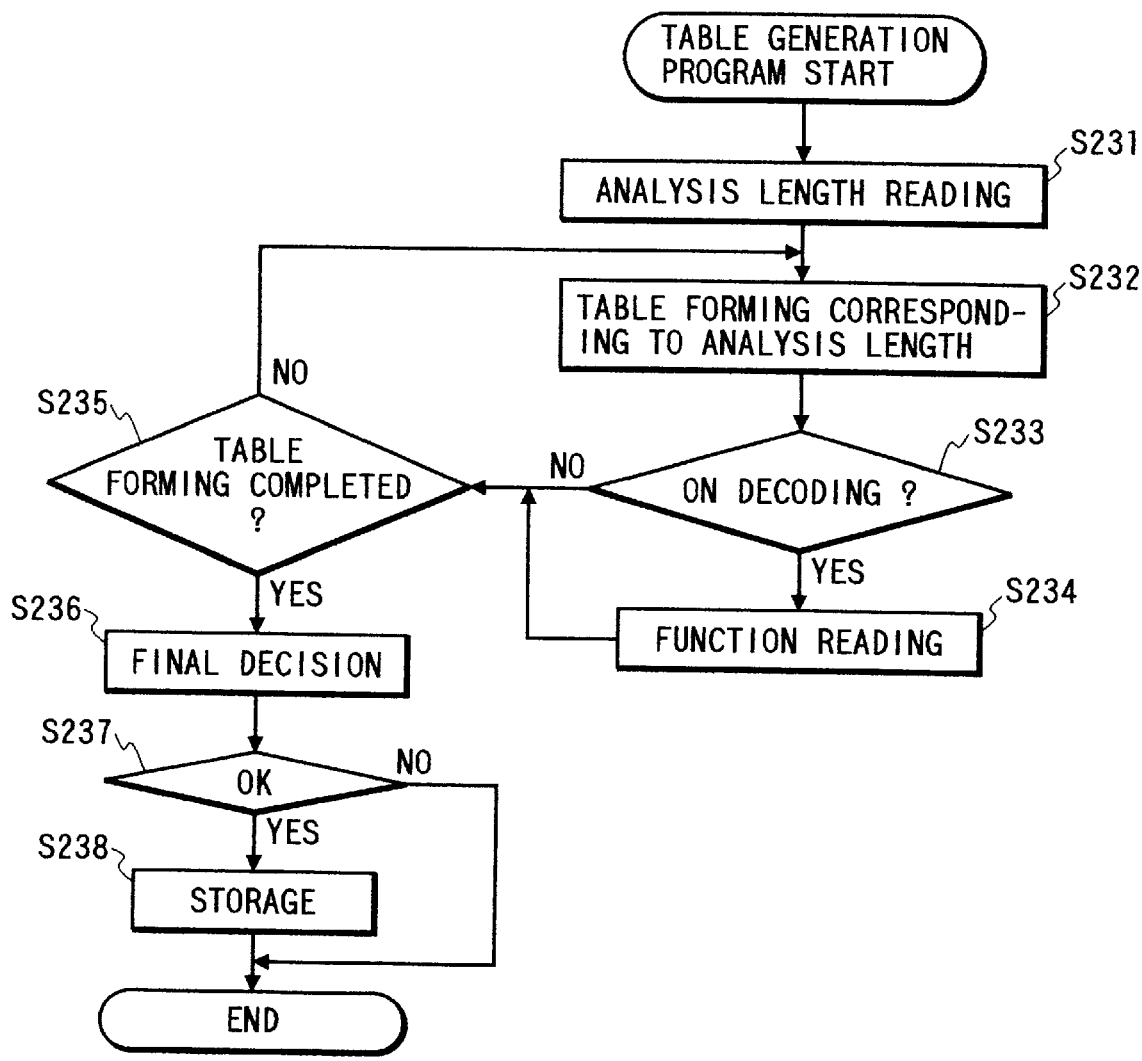
FIG. 14 is a flow chart showing in detail step S23 in FIG. 13.

FIG. 14 is a flow chart for explaining in detail the table formation in step S23 above.

In step S231, the number of steps and the analysis lengths in the respective steps are read out. In step S232, a table is formed in correspondence with the analysis length. For example, if the analysis length is 3 bits, 8 different table addresses, i.e., combinations (0, 0, 0) to (1, 1, 1) of the respective bits, are generated, and the corresponding code lengths and decoded results (decoded values) or the reference addresses and the next analysis code lengths are stored as their contents, as shown in FIG. 9. In this case, only one table address is formed at one time, and the flow advances to step S233. In step S233, the formed table contents are checked, and if the contents include a reference address, a function is read out in step S234. On the other hand, if the contents include a decoded value or after completion of the function, it is checked in step S235 if all the table addresses are formed. If NO in step S235, the flow returns to step S232 to form one table address.

The first reference address in step S232 assumes a value obtained by adding 8 ($2^3$) to the start address of the table if, for example, the analysis bit length (=3). On the other hand, the second or subsequent reference address to be written assumes a value obtained by adding 1 to the above address since a new table address is formed and updated upon reading of the function.

In step S236, the table amount is calculated based on the end address after table formation. It is then checked in step S237 if the table amount is a minimum value or equal to or smaller than a reference value. If the table amount is equal to or smaller than the reference value, necessary information is stored in step S238.

Figure 15:
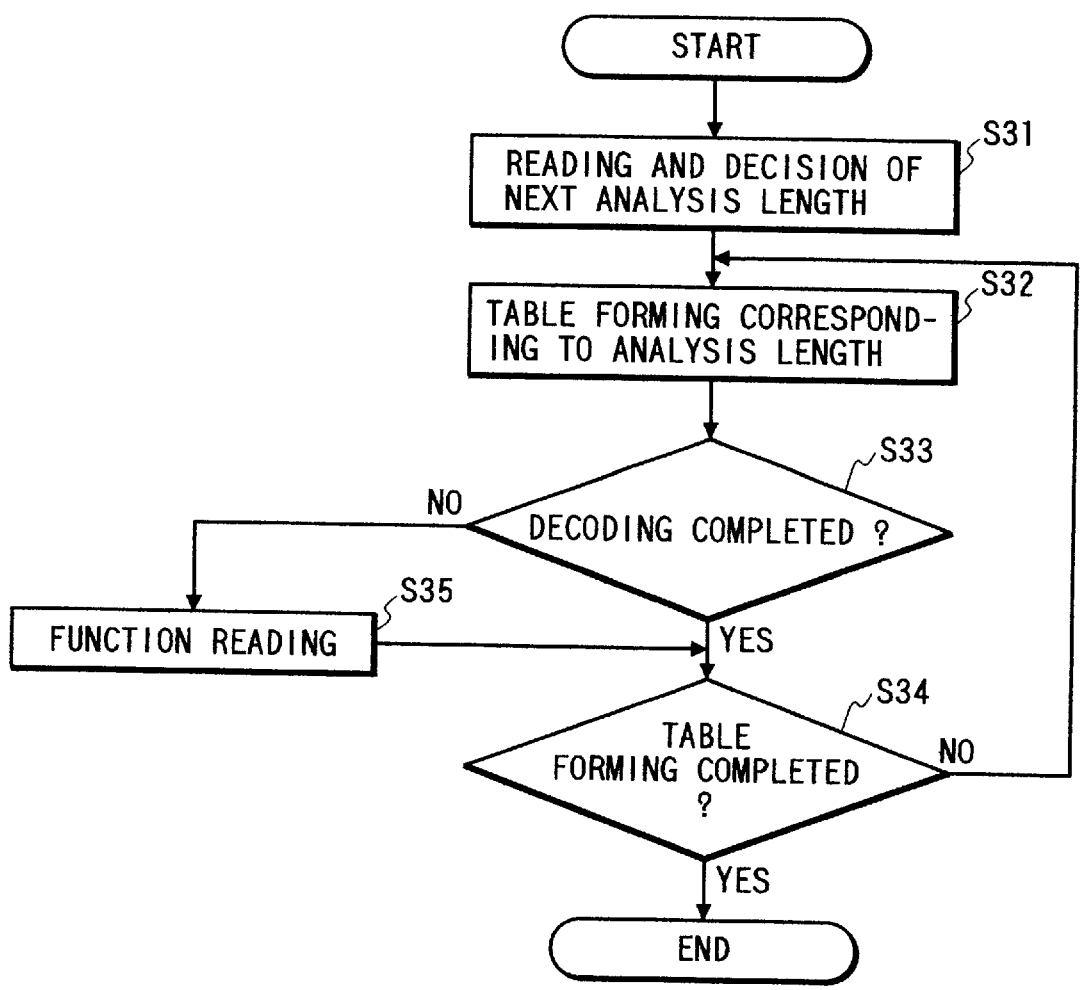
FIG. 15 is a flow chart associated with a function in FIG. 14.

The above-mentioned function is as shown in FIG. 15. In step S31, the next analysis bit length corresponding to the analysis bit length in the step next to the step that called the function is read out, and the analysis bit length determined by the table reduction processing (first table forming method) in the final step is determined. In step S32, a table is formed in correspondence with the analysis bit length. This operation is the same as that in step S232 in FIG. 14, and the subsequent steps S33 and 34, and function reading in step S35 are the same operations as in steps S233 to S235 in FIG. 14.

In the table formation in step S32 as well, when decoding is completed with the analysis bit length, new table contents are written at an address obtained by adding a value obtained by converting the analysis bit arrangement into a binary value to the reference address in the previous step. On the other hand, when table contents to be generated include a reference address, the reference address generated for the first time in the function assumes a value obtained by adding $2^n$ (n is the analysis bit length of the reference address) to the reference address in the previous step. Upon generation of the second or subsequent reference address value, (a value updated by the destination of the first or subsequent function calling)+1 is used as the reference address.

Therefore, in the decoding table format, as shown in FIG. 16, if F indicates various decoded values, Rxx indicates the reference addresses and storage addresses of the next analysis bit lengths, and these addresses are described in the left column in FIG. 16, values A(R1) and A(R2) are written at reference addresses R1 and R2. Similarly, the address of A(Rxx) is written at Rxx. This table order is determined by the function calling order. For example, the value A(R2) of the reference address R2 is determined by adding 1 to the end address after the second function calling processing.

Fourth Table Forming Method

In the third table forming method, a minimum table is obtained. In contrast to this, in this method, a table is formed to attain fastest decoding. This can be realized by replacing step S236 in FIG. 14 in the third table forming method by FIG. 17. Note that the fastest decoding means simultaneous retrieval (analysis) of 16 bits. Thus, this method is effective when the number of steps or combinations is limited in steps S21 and S22 in FIG. 13.

Figure 17:
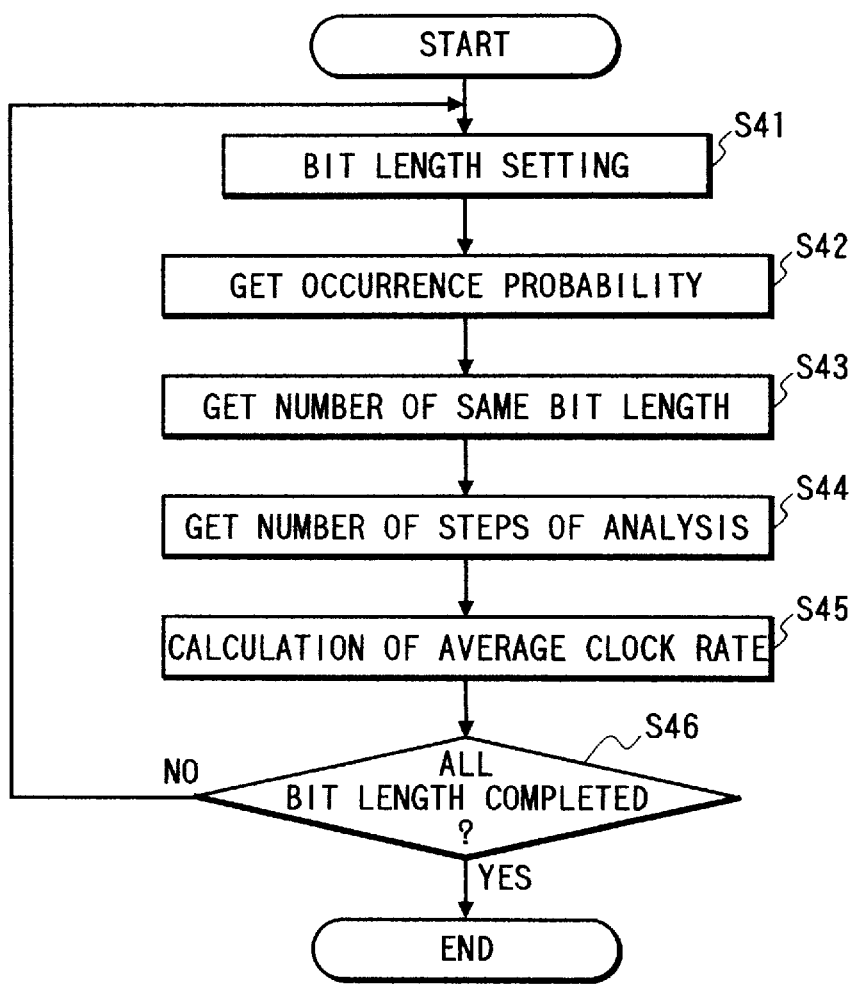
FIG. 17 is a flow chart showing the fourth table forming method.

FIG. 17 is a flow chart for calculating the average number of decoding steps (clocks).

In step S41, a Huffman code length n is set to be 1. In step S42, an occurrence probability h of codes having the Huffman code length n set in step S41 is calculated. The probability h is given by $h=(\frac{1}{2})^n$. In step S43, a value P indicating the number of codes having the Huffman code length n is calculated. In step S44, $(\frac{1}{2})^n \times n \times P$ is calculated to obtain (the occurrence probability×the average number of steps. In step S46, it is checked if the calculations are completed for all the Huffman code lengths. If NO in step S46, the bit length is incremented by "1", and the flow returns to step S41. In step S45, the calculated result is added to the occurrence probability×the average number of steps obtained so far. Therefore, the average number of steps can be finally obtained for all the Huffman code lengths.

If it is determined in step S237 in FIG. 14 that the calculated average number of steps is minimum, the calculated value is stored in step S238, thus obtaining the fastest decoding table.

Fifth Table Forming Method

Figure 18:
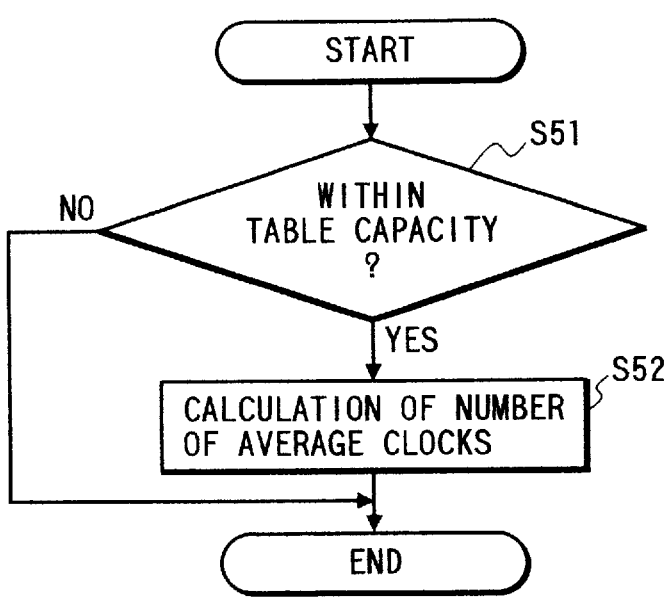
FIG. 18 is a flow chart showing the fifth table forming method.

In particular, when the decoding table amount is determined by, e.g., the hardware arrangement, the table amount need not have a minimum value, but need only fall within the table capacity. Therefore, in order to obtain a fastest table within a predetermined table capacity, the final decision step S236 in FIG. 14 is modified, as shown in FIG. 18.

If it is determined in step S51 that the formed table falls within the table capacity, the average number of clocks is calculated in step S52, and the processing ends. If it is determined in step S51 the formed table exceeds the table capacity, the average number of clocks is set to be a maximum value. It is then checked in step S237 in FIG. 14 if the average number of clocks in decoding is minimum. If the average number of clocks is minimum, the table information is stored in step S238.

With the above-mentioned operation, a Huffman decoder which performs fastest decoding within the allowable table capacity range of a particular hardware arrangement can be obtained.

Upon formation of a table corresponding to the analysis length in each step, if decoding is performed for, e.g., 3 bits, eight table addresses are generated. In this case, when a decoded value is determined based on the upper 2 bits, and the lower 1 bit is a subsequent code, the lower 1 bit is not determined to be either "0" or "1", and two table addresses having the same contents are generated for the address determined by the upper 2 bits. If a decoded value is determined by an upper 1 bit, table address for the lower 2 bits, i.e., a total of four table addresses having the same contents are generated to have the upper 1 bit as a common address.

In a bit string whose decoded value cannot be determined in decoding for 3 bits, a complete existing Huffman code cannot be obtained unless the subsequent bit string including at least one bit is looked up. Thus, the start address for storing the corresponding table is stored in the table contents as the reference address. The reference address value is as described above.

In this method, an absolute address of the decoding table is used as the reference address. When a relative address as the difference from the table address for storing the reference address is used as the reference address, the bit length required for storing the reference address can be reduced.

Furthermore, since the average number of clocks required for decoding processing can be obtained by modifying this embodiment, it is easy to use a table which performs a high-speed operation of a predetermined average number of clocks or less, and has the smallest table capacity as the final table.

As described above, according to the above-mentioned embodiment, coded data such as a Huffman code can be decoded at high speed using a decoding table with a small capacity.

Since a decoding table which can attain decoding with a small capacity can be formed based on predetermined combinations of the numbers of analysis steps and the analysis bit lengths, decoding can be attained by a limited hardware resource, and the remaining memory area of the table can be assigned to other work areas.

A table format with the smallest capacity or the highest speed can be selected and used within the predetermined table capacity range.

Furthermore, since the memory capacity is reduced in the final step, decoding can be attained using a smaller table capacity.

According to the above-mentioned embodiment, since at least one of divided data has a bit length different from those of other divided data, an optimal bit length of the divided data can be set in correspondence with the length or occurrence frequency of coded data, thus improving the decoding efficiency of coded data.

When a Huffman code is used for coded data, the data compression rate can be improved.

When a table is used in decoding of coded data, the coded data can be decoded at high speed.

When coded data having a small code length have a high occurrence frequency and coded data having a large code length have a low occurrence frequency, the first divided data is set to have a large bit length, so that most coded data can be decoded in the first analysis, thus attaining high-speed processing. In addition, when the second or subsequent divided data is set to have a small bit length, idle table addresses upon analysis of coded data can be omitted, thus reducing the table capacity. Even when the number of second and subsequent analyses of coded data increases due to the small bit length of the second or subsequent divided data, coded data which cannot be decoded in the first analysis have a low occurrence frequency, and have almost no influence on the total processing time, thus avoiding a decrease in total processing speed.

When the occurrence frequency of coded data which are used as codes for quantized values after DCT transformation for compressing an image including many high-frequency components as in the JPEG method, and have a large code length is relatively high, the first divided data is set to have a small bit length, and idle table addresses generated in the first analysis can be omitted, thus reducing the table capacity. When the second or subsequent divided data is set to have a large bit length, most coded data can be decoded, thus allowing high-speed processing. Most Huffman codes used for compressing an image have the same former half bits, and can use a common reference address for designating the next divided data in table retrieval. For this reason, since many decoded results of Huffman codes can be designated by one reference address, generation of idle table addresses can be suppressed.

When the retrieval table adopts a word format that can designate the bit length of the next divided data, the bit length of the next divided data can be changed each time divided data is analyzed. For this reason, the retrieval table can be formed in correspondence with the feature of a code following a bit sequence which is being analyzed, thus attaining high-speed decoding of coded data, and reducing the table capacity. For example, when a bit sequence in given coded data is analyzed halfway, and the remaining code following the bit sequence is short, idle table addresses can be omitted by performing analysis of a small bit length suitable for the short code, thereby reducing the table capacity. When a bit sequence in given coded data is analyzed halfway, the remaining code following the bit sequence is long, and its code length is equal to the bit sequence, high-speed decoding can be attained while generating almost no idle table addresses.

What is claimed is:

1. A decoding apparatus for decoding first coded data and second coded data comprising:

first decoding means for decoding the first coded data by dividing the first coded data into at least one data segment, each data segment having a bit length of not less than 1 bit; and second decoding means for decoding the second coded data on the basis of a run length of "1"s or "0"s and on the basis of a remaining bit string, said second decoding means sharing at least a common circuit portion with said first decoding means, wherein said decoding apparatus selectively outputs one of a decoding result of said first decoding means and a decoding result of said second decoding means.

2. An apparatus according to claim 1, wherein the circuit portion is one of a retrieval table using a value generated based on an input bit string as an address, and a shifter for shifting the analyzed bit string.

3. An apparatus according to claim 1, wherein said second decoding means comprises a conversion unit for controlling a shift amount of a shifter on the basis of the run length and the remaining bit string.

4. An apparatus according to claim 3, wherein said conversion unit comprises:

a register which pre-stores the shift amount of the shifter on the basis of the run length and the remaining bit string;

a comparison unit for comparing the run length with a predetermined value;

a decision unit for discriminating if the remaining bit string includes a predetermined bit string; and a control unit for controlling an output of said register on the basis of a comparison result from said comparison unit and a decision result from said decision unit.

5. An apparatus according to claim 1, wherein said second decoding means comprises a second conversion unit for generating an address for designating an empty area of a retrieval table on the basis of the run length and the remaining bit string, and the retrieval table stores a decoded value corresponding to the run length and the remaining bit string in the empty area.

6. An apparatus according to claim 1, further comprising:

a retrieval table having a word format consisting of a first bit area for storing a decoded value or a reference address, a second bit area for storing a Huffman code length of the decoded value, and a flag area for storing a retrieval completion flag; and control means for outputting the decoded value stored in the first bit area and the Huffman code length stored in the second bit area, or performing control for analyzing the next divided data with reference to the reference address stored in the first bit area, in correspondence with a value of the retrieval completion flag.

7. A decoding method for decoding coded data, comprising:

a first decoding step of decoding the coded data on the basis of a run length of "1"s or "0"s and on the basis of a first portion of a remaining bit string of the coded data so as to obtain intermediate data; and a second decoding step of dividing a second portion of the remaining bit string into at least one data segment, each data segment having a bit length of not less than one bit, and decoding by using said intermediate data and at least one data segment.

8. A decoding method according to claim 7, wherein the first portion and the second portion together constitute the entire remaining bit string.

9. A decoding apparatus for stepwisely decoding coded data in up to a plurality of steps, the coded data being input as a bit stream, each step including retrieving information from a decoding table based on a settable number of bits, comprising:

a controller for, when decoding is not completed, variably setting the number of bits to be analyzed in the next step on the basis of information obtained from the decoding table, and controlling the decoding on the basis of the set number of bits.

10. An apparatus according to claim 9, wherein the number of bits to be analyzed in the first step is set to be large, and the number of bits to be analyzed in the second or subsequent step is set to be small.

11. An apparatus according to claim 9, wherein the number of bits to be analyzed in the first step is set to be small, and the number of bits to be analyzed in the second or subsequent step is set to be large.

12. An apparatus according to claim 9, wherein the number of bits to be analyzed in the next step is written in the decoding table.

13. An apparatus according to claim 9, wherein the coded data is a Huffman code.

14. A method of forming a decoding table used in a decoding apparatus, the decoding apparatus for stepwisely decoding coded data in up to a plurality of steps, the coded data being input as a bit stream and being decoded by retrieving information from the decoding table based on units of a settable number of bits, said method comprising:

controlling the forming of the decoding table such that when the number of remaining bits to be analyzed in a final step of decoding is smaller than a predetermined number of bits, the decoding table is generated so that the number of bits to be analyzed in the next step is set to be not greater than a number of remaining bits identified in a step before the final step.

15. A method according to claim 14, wherein the coded data is a Huffman code.

16. A method of forming a decoding table used in a decoding apparatus for analyzing and decoding coded data, which is input as a bit stream, by performing retrieval with respect to the decoding table in units of a predetermined number of bits in one or a plurality of steps, comprising the steps of:

setting a maximum number of steps, and obtaining all combinations of steps;

setting the number of bits to be analyzed next in each of steps constituting each of the combinations, and generating a plurality of tables by performing the setting operation of the number of bits for all the combinations; and selecting a table having a minimum capacity from the plurality of tables.

17. A method of forming a decoding table used in a decoding apparatus for analyzing and decoding coded data, which is input as a bit stream, by performing retrieval with respect to the decoding table in units of a predetermined number of bits in one or a plurality of steps, comprising the steps of:

setting a maximum number of steps, and obtaining all combinations of steps;

setting the number of bits to be analyzed next in each of steps constituting each of the combinations, and generating a plurality of tables by performing the setting operation of the number of bits for all the combinations; and selecting a table which can attain decoding at the highest speed from the plurality of tables.

18. A method according to claim 17, wherein an occurrence probability of codes having a bit length m of the coded data is represented by $(½)^m$, an average number of steps is calculated from a product sum of the occurrence probability, the number of types of codes, and the number of steps, an average decoding speed is calculated from a reciprocal number of the average number of steps, and a table which can attain decoding at the highest speed is selected on the basis of the average decoding speed.

19. A method of forming a decoding table used in a decoding apparatus for analyzing and decoding coded data, which is input as a bit stream, by performing retrieval with respect to the decoding table in units of a predetermined number of bits in one or a plurality of steps, comprising the steps of:

setting a maximum number of steps, and obtaining all combinations of steps;

setting the number of bits to be analyzed next in each of steps constituting each of the combinations, and generating a plurality of tables by performing the setting operation of the number of bits for all the combinations; and selecting a table which can attain decoding at the highest speed from those having a capacity not more than a predetermined capacity of the plurality of tables.

20. A method according to claim 19, wherein an occurrence probability of codes having a bit length m of the coded data is represented by $(½)^m$, an average number of steps is calculated from a product sum of the occurrence probability, the number of types of codes, and the number of steps, an average decoding speed is calculated from a reciprocal number of the average number of steps, and a table which can attain decoding at the highest speed is selected on the basis of the average decoding speed.

21. A method of forming a decoding table used in a decoding apparatus for analyzing and decoding coded data, which is input as a bit stream, by performing retrieval with respect to the decoding table in units of a predetermined number of bits in one or a plurality of steps, comprising the steps of:

setting a maximum number of steps, and obtaining all combinations of steps;

setting the number of bits to be analyzed next in each of steps constituting each of the combinations, and generating a plurality of tables by performing the setting operation of the number of bits for all the combinations; and selecting a table having a minimum capacity from those which can attain decoding at not less than a predetermined speed of the plurality of tables.

22. A decoding method comprising:

dividing a bit sequence of coded data into data segments, each data segment having a bit length of not less than one bit; and retrieving information from a decoding table by successively using each of the data segments, so as to perform decoding, wherein at least one of the data segments has a bit length different from an other data segment.

23. A method according to claim 22, wherein the coded data is a Huffman code.

24. A method according to claim 22, wherein a bit length of a first data segment of the divided data is larger than a bit length of a second or subsequent data segment which is being analyzed.

25. A method according to claim 22, wherein a bit length of a first data segment of the divided data is smaller than a bit length of a second or subsequent data segment which is being analyzed.

26. A method according to claim 22, wherein the table has a word format for designating a bit length of the next data segment.

27. A decoding apparatus comprising:

input means for dividing a bit sequence of coded data representing a single code into plural data segments each having a bit length of not less than 1 bit, and for fetching the data segments;

control means for setting the bit length of each of the data segments fetched by said input means in accordance with a sequential order of the data segments; and decoding means for retrieving information from a decoding table by successively using the data segments, in order to decode the coded data.

28. An apparatus according to claim 27, wherein the coded data is a Huffman code.

29. An apparatus according to claim 27, wherein the bit length of a data segment set by said control means is larger than the bit length of a subsequent data segment which is being analyzed.

30. An apparatus according to claim 27, wherein the bit length of a data segment set by said control means is smaller than the bit length of a subsequent data segment which is being analyzed.

31. An apparatus according to claim 27, wherein said decoding table has a word format for designating the bit length of the next data segment, and said control means sets the bit length designated by said decoding table to be the bit length of the data segment to be fetched by said input means.

32. An apparatus according to claim 27, wherein said decoding table has a word format consisting of a first bit area for storing a decoded value or a reference address, a second bit area for storing a Huffman code length of the decoded data or the bit length of the next data segment, and a flag area for storing a retrieval completion flag, and wherein said control means determines in correspondence with a value of the retrieval completion flag whether the decoded value stored in the first bit area is output or whether a data segment having the bit length stored in the second bit area is analyzed with reference to the reference address.

* * * * *

UNITED STATES PATENT AND TRADEMARK OFFICE
CERTIFICATE OF CORRECTION

PATENT NO. : 5,835,033

DATED : November 10, 1998

INVENTOR : Yoshinobu Mita

It is certified that error appears in the above-identified patent and that said Letters Patent is hereby corrected as shown below:

<u>IN THE DRAWINGS</u>:

Sheet 3, Figure 3, "UMIT 3" should read --UNIT 3--.

<u>COLUMN 7</u>

Line 16, "prepared" should read --be prepared--; and
Line 35, "is" should read --is "2"--.

<u>COLUMN 15</u>

Line 15, "34," should read --S34,--; and
Line 60, "(the" should read --the--.

<u>COLUMN 20</u>

Line 61, "an other" should read --another--.

Signed and Sealed this

Sixth Day of July, 1999

Attest:

Q. TODD DICKINSON

*Attesting Officer*   Acting Commissioner of Patents and Trademarks